United States Patent [19]

Muckelroy et al.

[11] 3,755,891

[45] Sept. 4, 1973

[54] THREE DIMENSIONAL CIRCUIT MODULES FOR THICK-FILM CIRCUITS AND THE LIKE AND METHODS FOR MAKING SAME

[76] Inventors: William L. Muckelroy, P. O. Box 9685, Washington, D.C. 20016; Sandra R. Hawkins, 406 Bernstein, Fort Bragg, N.C.

[22] Filed: June 3, 1971

[21] Appl. No.: 149,434

[52] U.S. Cl. .......... 29/628, 317/101 CC, 317/101 D

[51] Int. Cl. .......... H05k 1/04

[58] Field of Search .......... 339/17 C; 317/101 D, 317/101 C, 101 R, 101 CW, 101 F, 101 CC; 29/624, 625, 628

[56] References Cited

UNITED STATES PATENTS

| | | | |
|---|---|---|---|
| 2,772,380 | 11/1956 | Andrew | 317/101 R |
| 2,720,578 | 10/1955 | Caffiaux et al | 317/101 C |
| 2,611,040 | 9/1952 | Brunetti | 317/101 C |
| 2,786,969 | 3/1957 | Blitz | 317/101 D |
| 3,134,049 | 5/1964 | Kilby | 317/101 D |

FOREIGN PATENTS OR APPLICATIONS

| | | | |
|---|---|---|---|
| 1,766,162 | 10/1969 | Germany | 317/101 F |

OTHER PUBLICATIONS

Roche, "Wrap Around Clip," IBM Tech. Disc. Bull. Vol. 5, No. 11, April 1963, p. 14.

*Primary Examiner*—David Smith, Jr.
*Attorney*—Harry M. Saragovitz, Edward J. Kelly, Herbert Berl and Saul Elbaum

[57] ABSTRACT

Three Dimensional Circuit Modules For Thick-Film Circuits And The Like And Methods For Making Same are provided in which such circuits are printed in selected portions on both the internal and external walls of a hollow cylindrical substrate to remove the cross-overs normally present in an equivalent planar circuit configuration. The circuit sections are disposed on the substrate such that common connections therebetween are effected by conductive clips straddling the end faces of the substrate in notches or declivities formed therein to receive the clips. Like declivities are utilized to both physically and electrically interconnect a plurality of substrates and/or external circuit components and the like. These substrates also comprise a housing for self-contained functional circuit modules of the foregoing type.

5 Claims, 7 Drawing Figures

Patented Sept. 4, 1973

3,755,891

2 Sheets-Sheet 1

INVENTOR

WILLIAM LAWRENCE MUCKELROY

SANDRA HELEN HAWKINS

BY Harry M. Saragovitz
Edward J. Kelly
Herbert Berl
Saul Elbaum

ATTORNEYS

Patented Sept. 4, 1973

3,755,891

2 Sheets-Sheet 2

INVENTOR

WILLIAM LAWRENCE MUCKELROY

SANDRA HELEN HAWKINS

BY Harry M. Saragovitz

Edward J. Kelly

Herbert Berl

Saul Elbaum

ATTORNEYS

THREE DIMENSIONAL CIRCUIT MODULES FOR THICK-FILM CIRCUITS AND THE LIKE AND METHODS FOR MAKING SAME

This invention relates to electric and electronic circuits and more particularly to non-planar, hybrid, thick-film circuit modules and the like and methods for fabricating same.

It is an object of this invention to provide a new and novel non-planar, thick-film circuit module structure.

It is another object of this invention to provide a new and novel non-planar, thick-film circuit module structure which obviates the need for printing crossover connections and is so structured as to enhance the production of such modules.

Another object of this invention is to provide a new and novel non-planar, thick-film circuit module structure having a cylindrical substrate with thick-film circuit means printed on both the interior and exterior surfaces thereof and including novel means effecting crossover connections between those circuit means.

Still another object of this invention is to provide a new and novel non-planar, thick-film circuit module structure and a new and novel method for producing same.

Yet another object of this invention to provide a new and novel non-planar, thick-film circuit module structure which is capable of housing itself and other like circuit modules and/or additional interconnected components.

These and other objects of the present invention will become more fully apparent with reference to the following specification and drawings which relate to several preferred embodiments of the present invention.

IN THE DRAWINGS

Basically, the invention includes a cylindrical substrate for thick film circuit networks in which crossover points between circuits printed on the inner and outer walls of the substrate are defined by notches or declivities in the rims of the cylinder. Conductors are printed up to the edge of these notches and the crossover connections are effected by the insertion of U-shaped spring clips into the notches such that the legs depend on either side of the notch and make electrical contact with the adjacent printed conductors.

The internal and external circuits are printed on the substrate by printers which are capable of printing through cylindrical screens by those techniques known in the art for producing flat planar thick film circuits.

In the provision of high density circuitry, the inner wall of the substrate can be printed (metallized) first, thereby permitting subsequent handling of the resulting circuit module without endangering the internal circuit. Large external components may be readily integrated with the module by hanging same in the crossover notches on the external wall of the module.

Furthermore, circuit density may be readily increased by utilizing concentrically nested substrates having interconnections and structural integrity provided by means of common conductor bars soldered or otherwise attached to crossover notches in adjacent substrates.

Cylindrical modules of the present invention also provide housings for self contained devices such as detonator devices (fuzes) and the like. For example, the inner cavity of the substrate can house explosives, detonators, batteries and safety and arming mechanisms as well as the control circuitry required for the operation of the housed components. External connections are provided as in the other embodiments of the invention by means of the crossover notches in the cylindrical substrate.

The cylindrical substrate can take the form of a dielectric coating on the inside of any suitable cylindrical housing for a desired product upon which coating a circuit can be printed by deposition of conductive and resistive epoxy pastes. This eliminates the sintering required for metallized thick film circuits where high temperature coefficient stability is unnecessary and results in a more economical fabrication of such circuits.

The invention obviates the present day need for effecting a multiplicity of crossover connections on flat ceramic substrates and therefore, obviates the dielectric isolation of layers, resulting interlayer capacitances from crossovers, incompatible sintering temperature problems and a host of other attendant problems now faced in prior art fabrication methods in thick-film circuit technology.

Referring in detail to the drawings and with particular reference to FIGS. 1, 2A, 2B and 2C, an illustrative preferred embodiment of the present invention will now be described.

Figures 1, 2A, 2B:
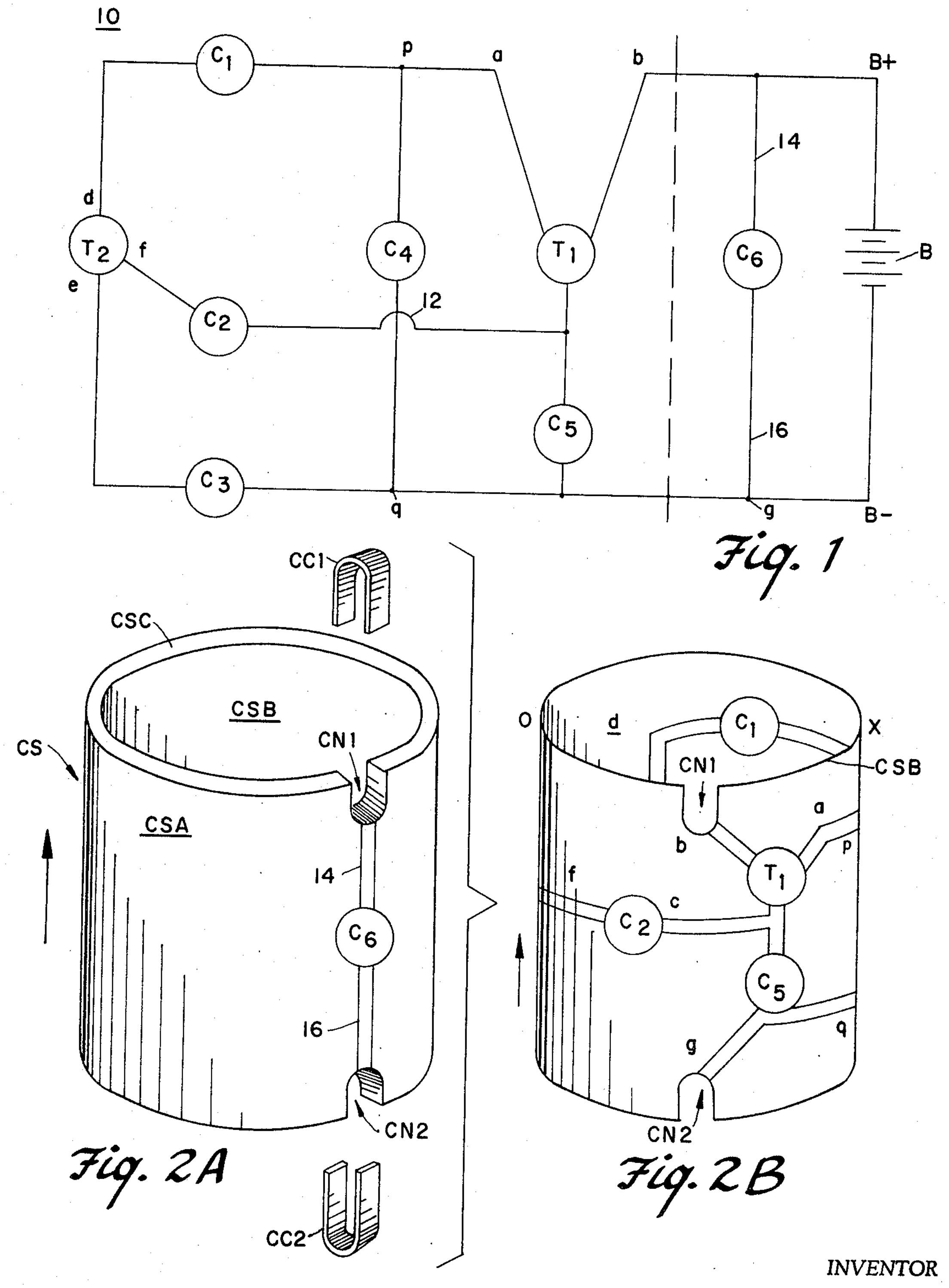
FIG. 1 is a schematic of a circuit to be incorporated into a preferred embodiment of the invention.
FIG. 2A is a perspective of a preferred embodiment of the present invention with a thick film circuit illustrated on the external wall portion thereof along with crossover connection means.
FIGS. 2B and 2C are opposed schematic views of the internal wall portion of FIG. 2A with a thick film circuit printed thereon.

In FIG. 1, a fuze network 10 is shown as including a first transistor T1 with terminal connections *a*, *b* and *c*; a second transistor T2 with terminal connections *d*, *e* and *f*; first through six components C1 — C6, respectively; and a battery B.

In a planar configuration, a thick-film embodiment of the circuit 10 would require a crossover connection 12, as shown in FIG. 1, in order to connect the second component C2 between the terminals *c* and *f* of the first and second transistors T1 and T2, respectively.

Furthermore, in a planar configuration, if the sixth component C6 is of the large discrete type, a special connection would have to be provided on a conventional planar, thick-film circuit module.

Figures 2C, 3, 4, 5:
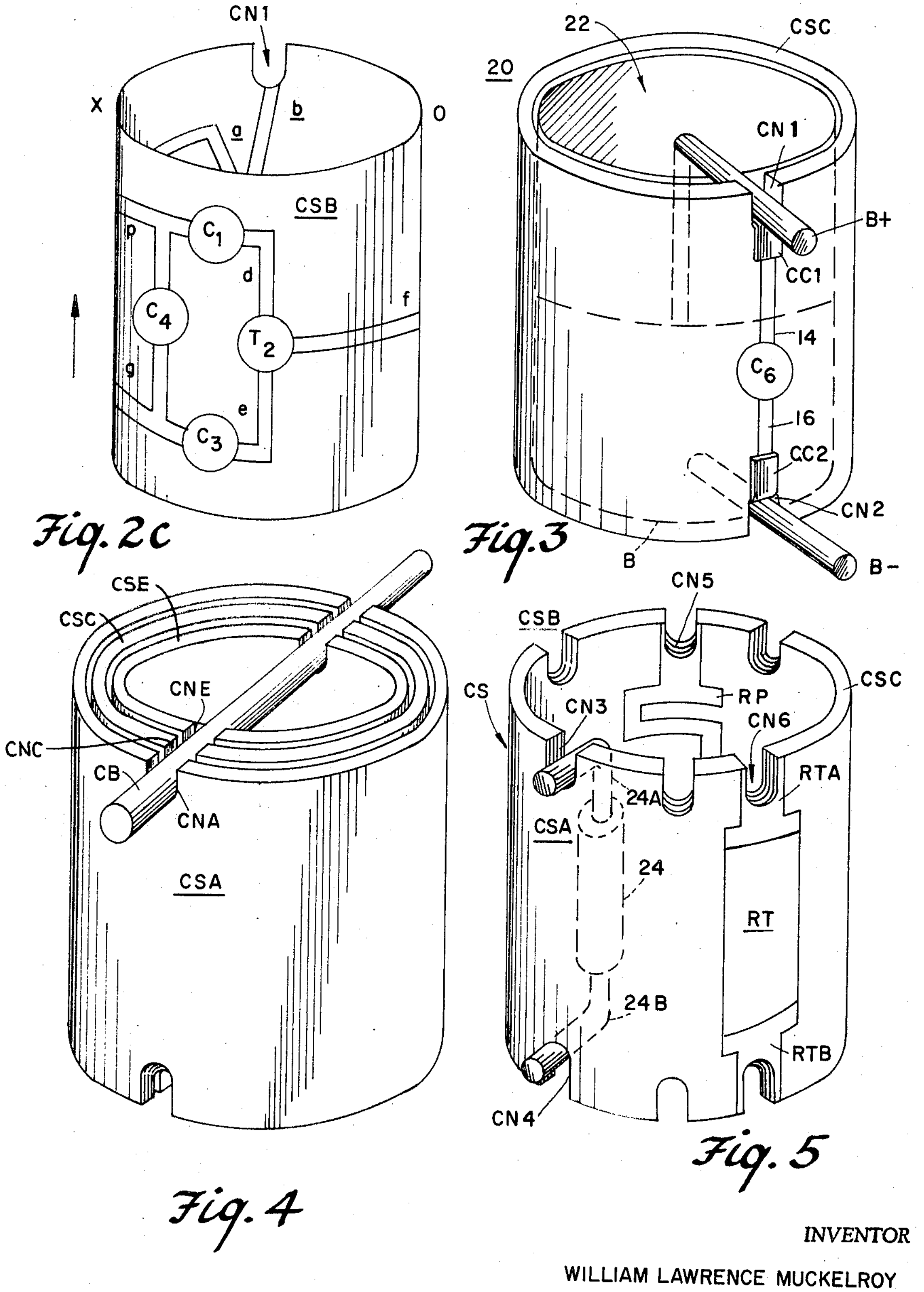
FIG. 3 is a perspective of an assembled circuit module of the present invention.
FIG. 4 is a partial perspective of a high density circuit module embodiment of the present invention.
FIG. 5 is a perspective of the cylindrical substrate of the present invention with various circuit components attached thereto.

Referring now to FIGS. 2A, 2B and 2C, the circuit 10 is shown separated into a three dimensional network by first breaking the circuit at the points *b* and *g* and printing conductors 14 and 16 and affixing the sixth capacitor C6 on the external wall CSA of a cylindrical substrate CS in a vertically disposed position as shown. The conductors 14 and 16 extend from the sixth component C6 to upper and lower crossover notches CN1 and CN2 cut through the rim portions CSC of the substrate CS (FIG. 2A).

The crossover 12 is eliminated by printing the balance of the circuit 10, excluding the battery B, on the internal wall CSB of the substrate CS as shown in FIGS. 2B and 2C.

The identifying characters *p*, *q* and *f* are indicative of the points of continuity in those portions of the circuit 10 illustrated in FIGS. 2B and 2C.

Crossover connections between the internal and external surface points *b*-14 and *g*-16 are made by the U-shaped connector clips CC1 and CC2 forced into the crossover notches CN1 and CN2, respectively, as illustrated in exploded position in FIG. 2A.

When seated in the upper crossover notch CN1, the first connector clip CC1 has its legs engaging and in electrical connection with the printed lead 14 and the terminal B of the first transistor T1. Likewise, when seated in the lower crossover notch CN2, the second connector clip CC2 has its legs engaging and in electrical connection with the printed lead 16 and the circuit terminal *g* of the circuit 10, rendering the latter complete in three-dimensional configuration upon the cylindrical substrate CS, with the exception of the battery B.

Referring now to FIG. 3, the utilization of the substrate CS and combined circuit 10 as a circuit module 20 housing internal related components 22, such as an explosive charge, and the battery B of FIG. 1, integrated into a component package totally contained within the cylindrical substrate CS is illustrated.

It is here that the structural advantage of the present invention for such integrated modular concepts becomes even more apparent.

By the simple expedient of utilizing relatively heavy conductor bars B+ and B–, corresponding to the terminals of the battery B and structurally unified with the other internal components 22, the entire module 20 is fully integrated by soldering or otherwise affixing these conductor bars B+ and B– into the upper and lower crossover notches CN1 and CN2, respectively, in electrical contact with the crossover connector clips CC1 and CC2, respectively. Thus, both a final structural as well as electrical connection is thereby effected to complete the circuit and component module 20.

Referring to FIG. 4, the present invention is schematically shown in an embodiment which materially increases circuit density by showing at least three concentrically nested cylindrical substrates CSA, CSC and CSE having adjacent crossover notches CNA, CNC and CNE, respectively, joined by a conductor bar (or bars) CB soldered or otherwise affixed therein to provide both structural and electrical interconnection between the said substrates CSA, CSC and CSE. The conductor bar CB may have connector clips integrated therewith of a configuration similar to the clips CC described in conjunction with the structure shown in FIG. 2A.

Referring next to FIG. 5, a substrate CS is shown with a variety of components affixed thereto to illustrate the versatility of the present invention.

For example, a relatively large conventional component 24 is shown suspended by bent bus bars or conductors 24A – 24B in a pair of upper and lower crossover notches CN3 – CN4; a printed zig-zag pattern resistor RP is partially shown on the internal surface CSB of the substrate CS extending from a crossover notch CN5; and a thick film resistor RT is shown disposed on the external surface CSA of the substrate CS extending, via printed conductors RTA and RTB, between a pair of upper and lower crossover notches CN6 – CN7.

As can be seen from the foregoing specification and drawings, the cylindrical substrate CS and the three-dimensional circuit capabilities thereof provide a new and novel circuit building block with a wide latitude of applicability in modular circuit construction heretofore unattainable in the art, particularly in thick-film circuit applications. Numerous modifications can be made within the scope of the claimed invention. Thus, it should be noted, for example, that the disclosed conductive clips can be replaced by any suitable conductive coating or metallization.

What is claimed is:

1. The method of making three dimensional printed circuit modules with the elimination of conventional crossovers in an equivalent planar circuit configuration, wherein said configuration comprises a network having at least one electrical path loop and at least two electrical paths connected across said loop and crossing each other, said crossing forming at least one crossover, comprising the steps of:
   separating said conventional planar circuit configuration into selected portions, wherein at least one of said portions comprises one of said two electrical paths connected across said electrical path loop;
   selectively printing one of said portions in three dimensional configuration on the internal or external wall of a hollow cylindrical substrate;
   arranging said portions on said substrate such that common connections between said circuit portions respectfully terminate in registry on said internal and external walls at an end face of said substrate;
   connecting a portion comprising said electrical path to said electrical path loop by utilizing a part of the surface of said hollow cylindrical substrate wherein crossovers are eliminated;
   providing a declivity in said end face extending between related ones of said common connections; and
   subsequently fitting a conductor in each such declivity in common electrical contact with those common connections associated therewith.

2. The method of claim 1 including the additional steps of:
   nesting an additional substrate and circuit thereon within the first;
   arranging said circuits such that common interconnection points between said circuits on adjacent substrates respectively terminate at adjacent end faces of said substrates;
   providing declivities in said end faces at said common interconnection points;
   arranging said substrates to align said declivities; and
   physically and electrically interconnecting said substrates and said circuits, respectively, by fixing substantially rigid conductors in said aligned declivities in electrical contact with those common interconnection points associated therewith.

3. The method of claim 1 including the additional steps of:
   placing an additional substrate and circuit thereon adjacent the first;
   arranging said circuits such that common interconnection points between said circuits on adjacent substrates respectively terminate at an end face of said substrates;

aligning said termination points; and physically and electrically interconnecting said substrates and said circuits, respectively, by physically bonding a substantially rigid conductor to said end faces in electrical contact with said interconnection points.

4. The method of claim 1 including the steps of:

forming additional declivities in related pairs in the end faces of said substrate; and physically attaching external circuit components having conductive terminals of said substrate by fixing the said conductive terminals in said additional declivities.

5. The method of claim 1 in the provision of interconnecting and mounting external circuit components with said circuits and on said substrate, respectively, wherein said external components have substantially rigid conductive terminals extending therefrom, comprising the additional steps of:

forming additional declivities in related pairs in the end faces of said substrate;

arranging said circuits on said substrate such that external circuit terminals thereof occur at said related pairs of declivities; and physically bonding said conductive terminals of said exernal components in said declivities in electrical contact with said external circuit terminals.

* * * * *